United States Patent
Choy et al.

(10) Patent No.: US 10,315,929 B2
(45) Date of Patent: Jun. 11, 2019

(54) SIMPLE APPROACH FOR PREPARING POST-TREATMENT-FREE SOLUTION PROCESSED NON-STOICHIOMETRIC NIOX NANOPARTICLES AS CONDUCTIVE HOLE TRANSPORT MATERIALS

(71) Applicant: The University of Hong Kong, Hong Kong (CN)

(72) Inventors: Wallace C.H. Choy, Shatin (HK); Fei Jiang, Shek Tong Tsui (HK)

(73) Assignee: THE UNIVERSITY OF HONG KONG, Hong Kong (CN)

( * ) Notice: Subject to any disclaimer, the term of this patent is extended or adjusted under 35 U.S.C. 154(b) by 434 days.

(21) Appl. No.: 14/883,131

(22) Filed: Oct. 14, 2015

(65) Prior Publication Data

US 2017/0110679 A1    Apr. 20, 2017

(51) Int. Cl.
*C01G 53/04* (2006.01)
*H01L 51/50* (2006.01)
*C01G 53/00* (2006.01)
*H01L 51/42* (2006.01)

(52) U.S. Cl.
CPC ............ *C01G 53/04* (2013.01); *C01G 53/003* (2013.01); *H01L 51/4273* (2013.01); *H01L 51/5056* (2013.01); *H01L 51/5088* (2013.01); *C01P 2002/72* (2013.01); *C01P 2002/85* (2013.01); *C01P 2004/04* (2013.01); *C01P 2004/64* (2013.01); *C01P 2006/40* (2013.01); *C01P 2006/60* (2013.01); *H01L 2251/5369* (2013.01); *Y02E 10/549* (2013.01)

(58) Field of Classification Search
CPC .... H01L 51/5056; C01G 53/003; C01G 53/04
See application file for complete search history.

(56) References Cited

PUBLICATIONS

Rahman, M. A., et al. "Nanosized nickel oxide particles and modification with poly (methyl methacrylate)." Polymers for Advanced Technologies 23.8 (2012): 1187-1193.*
Stern, Lucas-Alexandre, and Xile Hu. "Enhanced oxygen evolution activity by NiOx and Ni (OH) 2 nanoparticles." Faraday discussions 176 (2015): 363-379.*

(Continued)

*Primary Examiner* — Richard M Rump
(74) *Attorney, Agent, or Firm* — Leason Ellis LLP

(57) ABSTRACT

High-quality non-stoichiometric $NiO_x$ nanoparticles are synthesized by a facile chemical precipitation method. The $NiO_x$ film can function as an effective p-type semiconductor or hole transport layer (HTL) without any post-treatments, while offering wide temperature applicability from room-temperature to 150° C. For demonstrating the potential applications, high efficiency is achieved in organic solar cells using $NiO_x$ HTL. Better performance in $NiO_x$ based organic light emitting diodes is obtained as compared to devices using PEDOT:PSS. The solution-processed $NiO_x$ semiconductors at room temperature can favor a wide-range of applications of large-area and flexible optoelectronics.

7 Claims, 5 Drawing Sheets

(56) References Cited

PUBLICATIONS

Jiang, Fei, et al. "Post-treatment-Free Solution-Processed Non-stoichiometric NiOx Nanoparticles for Efficient Hole-Transport Layers of Organic Optoelectronic Devices." Advanced Materials 27.18 (2015): 2930-2937.*

Z. He, C. Zhong, S. Su, M. Xu, H. Wu, Y. Cao, "Enhanced power-conversion efficiency in polymer solar cells using an inverted device structure," Nat. Photonics (2012), vol. 6, pp. 591-595.

J. You, C.-C. Chen, Z. Hong, K. Yoshimura, K. Ohya, R. Xu, S. Ye, J. Gao, G. Li, Y. Yang, "10.2% Power Conversion Efficiency Polymer Tandem Solar Cells Consisting of Two Identical Sub-Cells," Adv. Mater. (2013), 25, pp. 3973-3978.

S. Liu, K. Zhang, J. Lu, J. Zhang, H. Yip, F. Huang, Y. Cao, "High-Efficiency Polymer Solar Cells via the Incorporation of an Amino-Functionalized Conjugated Metallopolymer as a Cathode Interlayer," J Am. Chem. Soc. (2013), 25, 135, pp. 15326-15329.

C.-C. Chen, W.-H. Chang, K. Yoshimura, K. Ohya, J. You, J. Gao, Z. Hong, Y. Yang, "An Efficient Triple-Junction Polymer Solar Cell Having a Power Conversion Efficiency Exceeding 11%," Adv. Mater. (2014), 26, pp. 5670-5677.

X. Li, W. C.H. Choy, L. Huo, F. Xie, W. E, l. Sha, B. Ding, X. Guo, Y. Li, J. Hou, J. You, Y. Yang, "Dual Plasmonic Nanostructures for High Performance Inverted Organic Solar Cells," Adv. Mater. (2012), 24, pp. 3046-3052.

G. Li, V. Shrotriya, J. Huang, Y. Yao, T. Moriarty, K. Emery, Y. Yang, "High-efficiency solution processable polymer photovoltaic cells by self-organization of polymer blends," Nat. Mater. (2005), vol. 4, pp. 864-863.

W.-Y. Wong, X.-Z. Wang, Z. He, A. B. Djurisic, C.-T. Yip, K.Y. Cheung, H. Wang, C. S. K. Mak, W.-K. Chan, , "Metallated conjugated polymers as a new avenue towards high-efficiency polymer solar cells," Nat, Mater. (2007), vol. 6, pp. 521-527.

Y. Liang, Z. Xu, J. Xia, S.-T. Tsai, Y. Wu, G. Li, C. Ray, L. Yu, "For the Bright Future—Bulk Heterojunction Polymer Solar Cells with Power Conversion Efficiency of 7.4%," Adv. Mater. (2010), 22, pp. E135-E138.

A. Rao, P. C. Y. Chow, S. Gelinas, C. W. Schlenker, C.-Z. Li, H.-L. Yip, A. K. Y. Jen, D. S. Ginger, R. H. Friend, "The role of spin in the Kinetic control of recombination in organic photovoltaics," Nature (2013), vol. 500, pp. 435-439.

H. Ma, H.-L. Yip, F. Huang, A. K. Y. Jen, "Interface Engineering for Organic Electronics," Adv. Funct. Mater. (2010), 20, 1371-1388.

Y. Liu, J. Zhao, Z. Li, C. Mu, W. Ma, H. Hu, K. Jiang, H. Lin, H. Ade, H. Yan, "Aggregation and morphology control enables multiple cases of high-efficiency polymer solar cells," Nat. Commun. (2014), 5:5293, pp. 1-8.

Y. He, H.-Y. Chen, J. Hou, Y. Li, "Indene-$C_{60}$ Bisadduct: A New Acceptor for High-Performance Polymer Solar Cells," J Am. Chem. Soc. (2010), 132, pp. 1377-1382.

Y. Shao, G. C. Bazan, A. J. Reeger, "LED to LEC Transition Behavior in Polymer Light-Emitting Devices**," Adv. Mater. (2008), 20, pp. 1191-1193.

T. Zheng, W. C.H. Choy, Y. Sun,"Hybrid Nanoparticle/Organic Devices with Strong Resonant Tunneling Behaviors," Adv. Funct. Mater. (2009), 19, pp. 2648-2653.

C. Min, C. Shi, W. Zhang, T. Jiu, J. Chen, D. Ma, J. Fang,Angew, "A Small-Molecule Zwitterionic Electrolyte without a p-Delocalized Unit as a Charge-Injection Layer for High-Performance PLEDs**," Chem. Int. Ed.(2013), 52, pp. 3417-3420.

Q. Zhang, B. Li, S. Huang, H. Nomura, H. Tanaka, C. Adachi, "Efficient blue organic light-emitting diodes employing thermally activated delayed fluorescence," Nat. Photonics. (2014), vol. 8, pp. 326-332.

A. N. Bartynski, C. Trinh, A. Panda, K. Bergemann, B. E. Lassiter, J. D. Zimmerman, S. R. Forrest, M. E. Thompson, "A Fullerene-Based Organic Exciton Blocking Layer with High Electron Conductivity," Nano Lett. (2013), 13, pp. 3315-3320.

F. Jiang, J. Wang, J. Li, N. Wang, X. Bao, T. Wang, Y. Yang, Z. Lan, R. Yang, Eur. J Inorg., "Supramolecular Assemblies with Symmetrical Octahedral Structures—Synthesis, Characterization, and Electrochemical Properties," Chem. (2013), 3, pp. 375-380.

M. C. Scharber, D. Muhlbacher, M. Kappe, P. Denk, C. Waldauf, A. J. Reeger, C.T. Brabec, "Design Rules for Donors in Bulk-Heterojunction Solar Cells—Towards 10% Energy-Conversion Efficiency**," Adv. Mater.(2006), 18, pp. 798-794.

M. Kemerink, S. Timpanaro, M. M. D. Kok, E. A. Meulenkamp, F. J. Touwslager, "Three-Dimensional Inhomogeneities in PEDOT:PSS Films," J Phys. Chem. B (2004), 108, 18820-1825.

Y. J. Lee, J. Yi, G. F. Gao, H. Koerner, K. Park, J. Wang, K. Y. Luo, R. A. Vaia, J. W. P. Hsu, "Low-Temperature Solution-Processed Molybdenum Oxide Nanoparticle Hole Transport Layers for Organic Photovoltaic Devices," Adv. Energy Mater. (2012), 2, pp. 1193-1197.

S. Murase, Y. Yang, "Solution Processed MoO 3 Interfacial Layer for Organic Photovoltaics Prepared by a Facile Synthesis Method," Adv. Mater. (2012), 24, pp. 2459-2462.

F. Xie, W. C.H. Choy, C. Wang, S. Zhang, J. Hou, "Low-Temperature Solution-Processed Hydrogen Molybdenum and Vanadium Bronzes for an Efficient Hole-Transport Layer in Organic Electronics," Adv. Mater. (2013), 25, pp. 2051-2055.

H. Choy, F. Xie, S. Zhang, J. Hou., "Room-temperature solution-processed molybdenum oxide as a hole transport layer with Ag nanoparticles for highly efficient inverted organic solar cellsł," J Mater. Chem. A (2013), 1, pp. 6614-6621.

F. Liu, S. Shao, X. Guo, Y. Zhao, Z. Xie, "Efficient polymerphotovoltaic-cellsusingsolution-processedMoO$_3$ as anode buffer layer," Sol. Energy Mater. Sol. Cells (2010), 94, 842-845.

X. Li, F. Xie, S. Zhang, J. Hou, W. C. H. Choy, "Over 1.1 eV Workfunction Tuning of Cesium Intercalated Metal Oxides for Functioning as Both Electron and Hole Transport Layers in Organic Optoelectronic Devices," Adv. Funct. Mater. (2014), 24, pp. 7348-7356.

T. Stubhan, N. Li, N. A. Luechinger, S. C. Halim, G. J. Matt, C. J. Brabec, "High Fill Factor Polymer Solar Cells Incorporating a Low Temperature Solution Processed WO$_3$ Hole Extraction Layer," Adv. Energy Mater. (2012), 2, pp. 1433-1438.

H. Zheng, Y. Tachibana, K. Kalantar-zadeh, "Dye-Sensitized Solar Cells Based on WO$_3$," Langmuir (2010), 26, pp. 19148-19152.

L. Cheng, Y. Hou, B. Zhang, S. Yang, J. W. Guo, L. Wua, H. G. Yang, Chem., "Hydrogen-treated commercial WO3 as an efficient electrocatalyst for triiodide reduction in dye-sensitized solar cellsł," Commun. (2013), 49, pp. 5945-5947.

K. Zilberberg, S. Trost, H. Schmidt, T. Riedl, "Solution Processed Vanadium Pentoxide as Charge Extraction Layer for Organic Solar Cells," Adv. Energy Mater. (2011), 1, pp. 377-381.

S. Y. Park, H. R. Kim, Y. J. Kang, D. H. Kim, J. W. Kang, "Organic solar cells employing magnetron sputtered p-type nickeloxide thin film as the anode buffer layer," Sol. Energy Mater. Sol. Cells (2010), 94, pp. 2332-2336.

Z. Huang, G. Natu, Z. Ji, M. He, M. Yu, Y. Wu, "Probing the Low Fill Factor of NiO p-Type Dye-Sensitized Solar Cells," J. Phys. Chem. C (2012), 116, pp. 26239-26246.

A. Garcia, G. C. Welch, E. L. Ratcliff, D.S. Ginley, G. C. Bazan, D. C. Olson, "Improvement of Interfacial Contacts for New Small-Molecule Bulk-Heterojunction Organic Photovoltaics,"Adv. Mater. (2012), 24, pp. 5368-5373.

K. H. Kim, C. Takahashi, T. Okubo, Y. Abe, M. Kawamura, "Influence of NiO anode buffer layer prepared by solution on performance of bulk-heterojunction solar cells," Appl. Surf Sci. (2012), 258, pp. 7809-7812.

K. Fominykh, J.M. Feckl, J. Sicklinger, M. Doblinger, S. Bocklein, J. Ziegler, L. Peter, J. Rathousky, E.-W. Scheidt, T. Bein, D. Fattakhova-Rohlfing, "Ultrasmall Dispersible Crystalline Nickel Oxide Nanoparticles as High-Performance Catalysts for Electrochemical Water Splitting," Adv. Funct. Mater. (2014), 24, pp. 3123-3129.

J. Zhang, J. Wang, Y. Fu, B. Zhang, Z. Xie, "Efficient and stable polymer solar cells with annealing-free solution-processible NiO nanoparticles as anode buffer layers," J. Mater. Chem. C (2014), 2, pp. 8295-8302.

(56) References Cited

PUBLICATIONS

E. L. Ratcliff, J. Meyer, K. X. Steirer, A. Garcia, J. J. Berry, D.S. Ginley, D. C. Olson, A. Kahn, N. R. Armstrong, "Evidence for near-Surface NiOOH Species in Solution-Processed $NiO_x$ Selective Interlayer Materials: Impact on Energetics and the Performance of Polymer Bulk Heterojunction Photovoltaics," Chem. Mater. (2011), 23, pp. 4988-5000.
J. G. Aiken, A.G. Jordan, "Electric Transport Properties of Single Crystal Nickel Oxide," J. Phys. Chem. Solids (1968), 29, pp. 2153-2167.
D. Adler, J. Feinleib, "Electrical and Optical Properties of Narrow-Band Materials," Phys. Rev. B (1970), 2, pp. 3112-3134.
W. K. Chen, N. L. Peterson, 'Cation Diffusion, Semiconductivity and Nonstoichiometry in (Co,Ni)O crystals**, J. Phys. Chem. Solids (1973), 34, pp. 1093-1108.
M. D. Irwin, B. Buchholz, A. W. Hains, R. P.H. Chang, T. J. Marks, "p-Type semiconducting nickel oxide as an efficiency-enhancing anode interfacial layer in polymer bulk-heterojunction solar cells," Proc. Nat. Acad. Sci. (2008), 105, pp. 2783-2787.
W. J. Yu, L. Shen, S. P. Ruan, F. X. Meng, J. L. Wang, E. R. Zhang, W. Y. Chen, "Performance improvement of inverted polymer solar cells thermally evaporating nickel oxide as ananode buffer layer," Sol. Energy Mater. Sol. Cells (2012), 98, pp. 212-215.
J. Li, F. Jiang, X. Wan, "Preparation and Characterization of Four Armed Star Polylactic Acid With Porphyrin Core," Acta Polym. Sin. (2012), 11, pp. 1314-1318.
X. Fan, G. Fang, F. Cheng, P. Qin, H. Huang,Y. Li, "Enhanced performance and stability in PBDTTT-C-T : $PC_{70}$ BM polymer solar cells by optimizing thickness of $NiO_x$ buffer layers," J. Phys. D: Appl. Phys. (2013), 46, 305106, 6 pp.
N. Wang, F. Jiang, Z. Du, X. Bao, T. Wang, R. Yang, "Design and synthesis of cholesterol-bonded fullerene and porphyrin derivatives for the preparation of a self-assembled donor-acceptor system," Supramol. Chem. (2012), 24, 819-825.
K. X. Steirer, P. F. Ndione, N. E. Widjonarko, M. T. Lloyd, J. Meyer, E. L. Ratcliff, A. Kahn, N. R. Armstrong, C. J. Curtis, D.S. Ginley, J. J. Berry, D. C. Olson, "Enhanced Efficiency in Plastic Solar Cells via Energy Matched Solution Processed $NiO_x$ Interlayers," Adv. Energy Mater. (2011), 1, pp. 813-820.
J. R Manders, S. W. Tsang, M. J. Hartel, T. H. Lai, S. Chen, C. M. Amb, J. R. Reynolds, F. So, "Solution-Processed Nickel Oxide Hole Transport Layers in High Efficiency Polymer Photovoltaic Cells," Adv. Funct. Mater. (2013), 23, pp. 2993-3001.
Z. Zhai, X. Huang, M. Xu, J. Yuan, J. Peng, W. Ma, "Greatly Reduced Processing Temperature for a Solution-Processed $NiO_x$ Buffer Layer in Polymer Solar Cells," Adv. Energy Mater. (2013), 12, pp. 1614-1622.
X. Liang, Q. Yi, S. Bai, X. Dai, X. Wang, Z. Ye, F. Gao, F. Zhang, B. Sun, Y. Jin, "Synthesis of Unstable Colloidal Inorganic Nanocrystals through the Introduction of a Protecting Ligand," Nano Lett. (2014), 14, pp. 3117-3123.
G. Williams, Q. Wang, H. Aziz, "The Photo-Stability of Polymer Solar Cells: Contact Photo-Degradation and the Benefits of Interfacial Layers," Adv. Funct. Mater. (2013), 23, pp. 2239-2247.
F. Jiang, N. Wang, Z. Du, J. Wang, Z. Lan, R. Yang, "Thiophene-Coated Functionalized M12L24 Spheres: Synthesis, Characterization, and Electrochemical Properties," Chem. Asian J (2012), 7, pp. 2230-2234.

V. Wood, M. J. Panzer, J.E. Halpert, J.M. Caruge, M. G. Bawendi, V. Bulovic, "Selection of Metal Oxide Charge Transport Layers for Colloidal Quantum Dot LEDs," ACS Nano (2009), 3, pp. 3581-3586.
A. Tan, W. Zhang, D. Qian, C. Cui, Q. Xu, L. Li, S. Lia, Y. Li, "Solution-processed nickel acetate as hole collectionlayer for polymer solar cells," Phys. Chem. Chem. Phys. (2012), 14, pp. 14217-1 4223.
V. D. Mihailetchi, P. W. M. Blom, J.C. Hummelen, M. T. Rspens, "Cathode dependence of the open-circuit voltage of polymer:fullerene, bulk, heterojunction sour cells," J Appl. Phys. (2003). 94, pp. 6849-6854.
S. H. Park. A. Roy, S. Beaupre, S. Cho, N. Coates, J. S. Moon, D. Moses, M. Leclerc, K. Lee. A. J. Heeger, "Bulk heterojunction solar cells with internal quantum efficiency approaching 100%," Nat Photonics (2009), 3, pp. 297-303.
T. Wang, N. W. Scarratt, H. Yi, A. D. F. Dunbar, A. J. Pearson, D. C. Watters, T. S. Glen, A. C. Brook, J. Kingsley, A. R. Buckley, M. W. A. Skoda, A. M. Donald, R. A. L. Jones, A. Iraqi, D. G. Lidzey, "Fabricating High Performance, Donor-Acceptor Copolymer Solar Cells by Spray-Coating in Air," Adv. Energy Mater. (2013), 3, pp. 505-512.
X. Lu, H. Hlaing, D. S. Germack, J. Peet, W. H. Jo, D. Andrienko, K. Kremer, B. M. Ocko, "Bilayer order in a polycarbazole-conjugated polymer," Nat. Commun. (2012), 3:795, 7 pp.
C. Duan, W. Cai, B. B. Y. Hsu, C. Zhong, K. Zhang, C. Liu, Z. Hu, F. Huang, G. C. Bazan, A. J. Heeger, Y. Cao, "Toward green solvent processable photovoltaic materials for polymer solar cells: the role of highly polar pendant groups in charge carrier transport and photovoltaic behaviort," Energy Environ. Sci. (2013), 6, pp. 3022-3033.
C.H. Peters, I. T. Sachs-Quintana, J.P. Kastrop, S. Beaupre, M. Leclerc, M. McGehee, "High Efficiency Polymer Solar Cells with Long Operating Lifetimes," Adv. Energy Mater. (2011), 1, pp. 491-494.
T. Ripolles-Sanchis, A. Guerrero, E. Azaceta, R. Tena-Zaera, G. Garcia-Belmonte, "Electrodeposited NiO anode interlayers: Enhancement of the charge carrier selectivity inorganic solar cells," Sol. Energy Mater. Sol. Cells (2013), 11 7, pp. 564-568.
E. L. Ratcliff, A. Garcia, S. A. Paniagua, S. R. Cowan, A. J. Giordano, D.S. Ginley, S. R. Marder, J. J. Berry, D. C. Olson, "Investigating the Infl uence of Interfacial Contact Properties on Open Circuit Voltages in Organic Photovoltaic Performance: Work Function Versus Selectivity," Adv. Energy Mater. (2013), 3, pp. 647-656.
E. L. Ratcliff, J. Meyer, K. X. Steirer, N. R. Armstrong, D. C. Olson, A. Kahn, "Energy level alignment in PCDTBT:$PC_{70}$BM solar cells: Solution processed $NiO_x$ for improved hole collection and efficiency," Org. Electron. (2012), 13, pp. 744-749.
H. Zheng, Y. Zheng, N. Liu, N. Ai, Q. Wang, S. Wu, J. Zhou, D. Hu, S. Yu, S. Han, W. Xu, C. Luo, Y. Meng, Z. Jiang, Y. Chen, D. Li, F.Huang, J. Wang, J. Peng, Y. Cao, "All-solution processed polymer light-emitting diode displays," Nat. Commun. (2013), 4:1971, 7 pp.
H. Wu, F. Huang, Y. Mo, W. Yang, D. Wang, J. Peng, Y. Cao, "Efficient Electron Injection from a Bilayer Cathode Considity of Aluminum and Alcohol-/Water-Soluble Conugated Polymers," Adv. Mater. (2004), vol. 16, No. 20, pp. 1826-1830.

\* cited by examiner

SIMPLE APPROACH FOR PREPARING POST-TREATMENT-FREE SOLUTION PROCESSED NON-STOICHIOMETRIC NIOX NANOPARTICLES AS CONDUCTIVE HOLE TRANSPORT MATERIALS

FIELD OF THE INVENTION

The present invention relates to an improved method for providing hole transport layers for optoelectronic devices.

BACKGROUND OF THE INVENTION

Organic solar cells (OSCs) and organic light emitting diodes (OLEDs) have gained increasing attention owing to their superior advantages of low cost, light weight, and flexibility of a variety of optoelectronic applications. One of the critical aspects in fabricating highly efficient and stable optoelectronic devices is the design of the functional carrier transport layers between the organic active layer and the electrodes. Typically, effective hole transport layers (HTLs) in optoelectronic devices have to satisfy electrical and optical requirements of (1) high electrical conductivity, (2) good optical transparency with wide bandgap, (3) good electron blocking with efficient hole transport. Poly(3,4-ethylenedioxythiophene):poly(styrene-sulfonate) (PEDOT:PSS) with a work function (WF) of 5.10 eV has been widely used as HTL in optoelectronic devices, such as conventional organic optoelectronics. However, there are some issues of its electrical and physical inhomogeneity, such as the long-standing acidic nature of PSS regarding the poor stability and severe degradation of organic optoelectronic devices. Alternatively, stable transition metal oxides (TMOs) such as $MoO_3$, $WO_3$, $V_2O_5$ and $NiO_x$, stand out as promising candidates for efficient HTLs. It is essential to develop a wide range of efficient and low-cost TMOs to serve as functional HTLs. Until now, low-temperature solution-processed approaches have been demonstrated for $MoO_3$, $WO_3$, and $V_2O_5$.

Differently, the valence band of $NiO_x$ is well aligned with the highest occupied molecular orbital (HOMO) levels or valence band of many typical organic and inorganic semiconductors, respectively, for hole transport which is distinct from other typical oxide based HTL materials such as $MoO_3$, $WO_3$ and $V_2O_5$. Besides, $NiO_x$ offers promising characteristics as an anode interlayer with wide bandgap semiconductor properties, good electron blocking and optical transparency. However, the fabrication of highly efficient $NiO_x$ HTLs by a low temperature solution process still remains a great challenge. $NiO_x$ is a cubic rock-salt structure with octahedral $Ni^{2+}$ and $O^{2-}$ sites. Pure stoichiometric nickel oxide is an excellent insulator with conductivity of $10^{-13}$ S $cm^{-1}$, while non-stoichiometric $NiO_x$ is a wide bandgap p-type semiconductor. Due to the positive charge compensation induced by thermodynamically favored cation vacancies, the non-stoichiometric NiOx shows a p-type conduction property.

The conventional ways of fabricating $NiO_x$ usually involve thermal annealing processes and oxygen-plasma treatment, which hinders the applications of $NiO_x$ in flexible optoelectronic devices (i.e. OLED/OSC).

BRIEF SUMMARY OF THE INVENTION

The present invention is directed to a chemical precipitation method for synthesizing $NiO_x$ nanoparticles. The synthesized $NiO_x$ can be used for producing $NiO_x$ HTL film in a room temperature solution process without any post-treatments during device fabrication.

Embodiments of the subject invention are drawn to a new approach, i.e., a chemical precipitation and combustion method creating HTLs is achieved by forming non-stoichiometric $NiO_x$ nanoparticles (NPs). The combustion in air promotes oxygen interactions with a nickel-deficient lattice, further forming different valence-state compositions, including NiO ($Ni^{2+}$), NiOOH ($Ni^{3+}$), and $Ni_2O_3$ ($Ni^{3+}$). The resultant nanoparticles are non-stoichiometric $NiO_x$ nanoparticles, which are important due to their dispersion in water, reaching up to a high concentration of 50 mg $L^{-1}$. The dark-black $NiO_x$ nanoparticles (powders) are very stable after 6 months during storage in an ambient environment, and the $NiO_x$ nanoparticle dispersions are stable after 15 days, and are still well dispersed without any precipitation or aggregation.

In an embodiment, a new approach can be used to form a $NiO_x$ HTL film through a room temperature solution process without any post-treatments including oxygen-plasma treatment and annealing treatment. The results show that the $NiO_x$ NPs film can function as effective HTLs over a wide range of annealing temperatures from room temperature to 150° C. The $NiO_x$ NPs film has superior optical, electrical and surface properties, and the work function is well aligned with HOMO levels and the valence band of many typical p-type conjugated polymers and inorganic semiconductors.

In another embodiment of the invention organic optoelectronic devices, using the $NiO_x$ NPs film as HTLs and commercially available polymer/organic materials as the active layer of organic solar cells (OSC), high power conversion efficiency (PCE) of 9.16% with $V_{OC}$ of 0.794 V, $J_{SC}$ of 18.32 mA $cm^{-2}$ and FF of 63.10% is achieved, which causes a noticeable enhancement compared with the control device using PEDOT:PSS as HTLs (PCE of 8.60%, $V_{OC}$ of 0.782 V, $J_{SC}$ of 18.03 mA $cm^{-2}$ and FF of 60.97%). The $NiO_x$ NPs film can also function as HTLs in organic light emitting diodes (OLEDs) based on the use of commercially available polymer/organic materials as the active layer. The OLED devices have a turn-on voltage of 3.75 V, a maximum brightness of 26630 cd $m^{-2}$ at 11.25 V, a current efficiency is 9.72 cd $A^{-1}$, which is higher than that of PEDOT:PSS-based devices with a maximum brightness of 23100 cd $m^{-2}$ at 12.50 V and a current efficiency of 9.20 cd $A^{-1}$. The results reveal that both OLEDs and OSCs with efficient $NiO_x$ HTLs can be comparable and competitive with that of PEDOT:PSS.

In a further embodiment, the synthesize method is a low cost process: no expensive and hi-tech equipment is required (only OSC and OLED devices fabrication is need), low cost materials (commercially available materials of Ni $(NO_3)_2 \cdot 6H_2O$ and NaOH), low energy consumption (low reaction time is only about five minutes, combustion process only needs 2 hours of energy consumption). In ambient environment, the $NiO_x$ based OSC devices show much better stability compared to the devices using PEDOT:PSS as HTLs.

The room temperature process for the formation of conductive thin films according to the invention can be applicable to various substrates, including flexible substrates which will deform upon thermal annealing and are not compatible with high temperature processes.

BRIEF DESCRIPTION OF THE DRAWINGS

The foregoing and other objects and advantages of the present invention will become more apparent when considered in connection with the following detailed description and appended drawings in which like designations denote like elements in the various views, and wherein.

DETAILED DISCLOSURE OF THE INVENTION

The subject invention relates to a new facile chemical precipitation and combustion method which is robust and simple for direct preparation of high quality non-stoichiometric $NiO_x$ NPs. By using this method, $NiO_x$ HTL film can be formed through a room temperature solution process without any post-treatments during device fabrication. Such a $NiO_x$ HTL film can be used in many applications, including but not limited to flexible optoelectronics, organic solar cells, organic light emitting diodes, and organic photodetectors.

$NiO_x$ nano-particles (NPs) can be obtained by a chemical precipitation and combustion method using commercially available materials of $Ni(NO_3)_2 \cdot 6H_2O$ and NaOH. The raw materials are easily dissolved in deionized water at room temperature to form a dispersion. After dropwise adding the base NaOH, the clear green aqueous solution turns turbid. By accurately controlling the solution pH value to 10, a considerable yield of ultrafine nickel hydroxide $Ni(OH)_2$ is obtained by precipitation. The obtained apple-green product is then dried to form an electrically insulted and undispersed intermediate. The step of using a base to form undispersed intermediate may involve use of a dispersing agent that is water/methanol, water/ethanol, or water/other alcoholic solvents. Next, the intermediate is subjected to grinding. This powder is then calcined at 270° C. for two hours in air to decompose it into dark-black $NiO_x$ NPs. This calcination procedure is based on the thermal decomposition of $Ni(OH)_2$ aiming to produce non-stoichiometric $NiO_x$ NPs. The dark-black $NiO_x$ nanoparticles (powders) are very stable after 6 months during storage in an ambient environment, and the $NiO_x$ nanoparticle dispersions are stable after 15 days and are still well dispersed without any precipitation or aggregation.

Equations 1 and 2 illustrate the chemical reactions in this procedure of forming non-stoichiometric $NiO_x$ NPs:

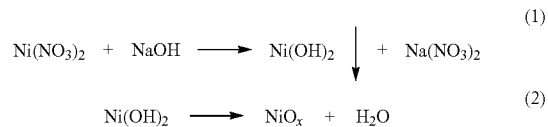

Figures 1A, 1B:
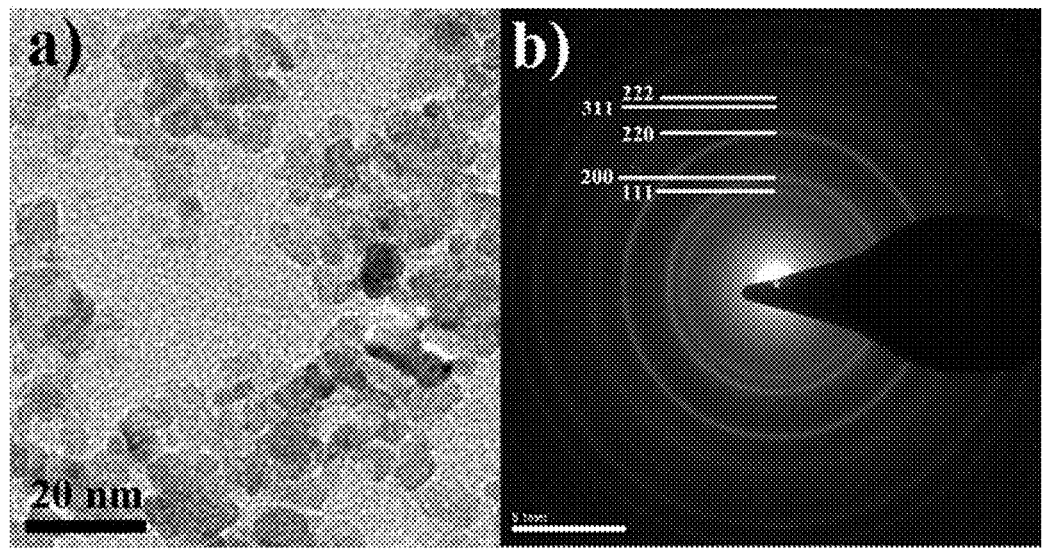
FIG. 1(a) is a TEM image of non-stoichiometric $NiO_x$ NPs with scale bar of 20 nm and FIG. 1(b) is a X-ray diffractometry line broadening (XRD-LB) result of $NiO_x$.

X-ray diffraction (XRD) to investigate the $NiO_x$ crystal structure and dimensions reveals diffraction peaks which show the $NiO_x$ as a cubic crystal structure. Three prominent characteristic diffraction peaks of $NiO_x$ cubic structure appear at 2θ which equals 37.11°, 43.08° and 62.25°, respectively. Among them, the strongest diffraction peak is observed when 2θ is 43.08°, which demonstrates that the $NiO_x$ NPs have already crystallized. The diameter (D) of the $NiO_x$ NPs is calculated by Debye-Scherrer equation: D=0.89λ/(β cos θ), from which it can be determine that the average crystalline size is 4 nm. Meanwhile, as shown in the transmission electron microscopy (TEM) results of FIG. 1, the $NiO_x$ nanoparticles with a good uniformity can be obtained. The particle size is about 3-5 nm, which is consistent with the X-ray diffractometry line broadening (XRD-LB) results.

The optical, electrical and surface properties of the $NiO_x$ thin films were examined by using different techniques. The $NiO_x$ dispersion was prepared by dispersing the $NiO_x$ NPs into water to a desired concentration from 5 mg $ml^{-1}$ to 50 mg $ml^{-1}$. The $NiO_x$ dispersion was spin-coated on pre-cleaned indium tin oxide (ITO) glass. The resultant $NiO_x$ films were annealed at different temperatures (from no annealing to 300° C.) under ambient environment. The thicknesses of corresponding $NiO_x$ films were ca. 4 nm (5 mg $ml^{-1}$), 12 nm (15 mg $ml^{-1}$), 20 nm (30 mg $ml^{-1}$) and 32 nm (50 mg $ml^{-1}$), which were measured by ellipsometry.

Figure 2A:
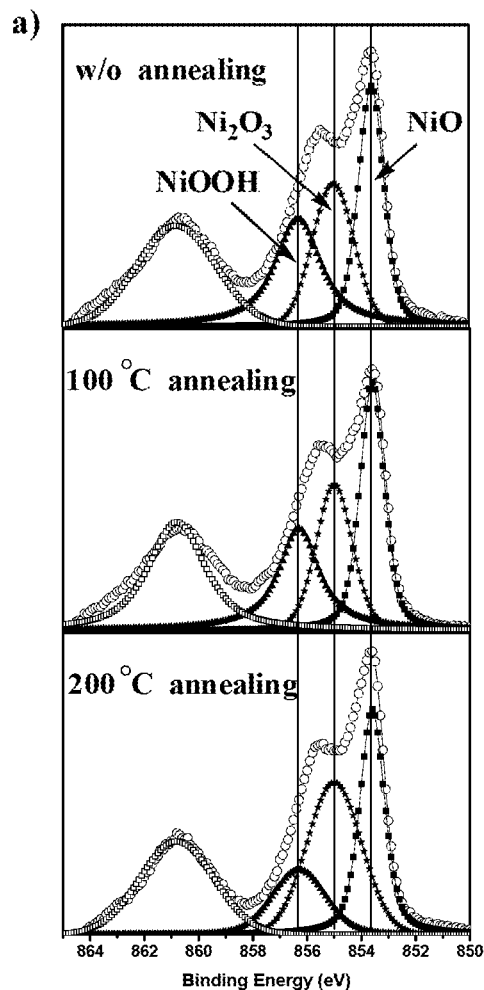
FIG. 2(a) is a XPS result of $NiO_x$ films of Ni $2p_{3/2}$ core level peaks and FIG. 2(b) is a XPS result of $NiO_x$ films of O 1 s core level peaks.
Figure 2B:
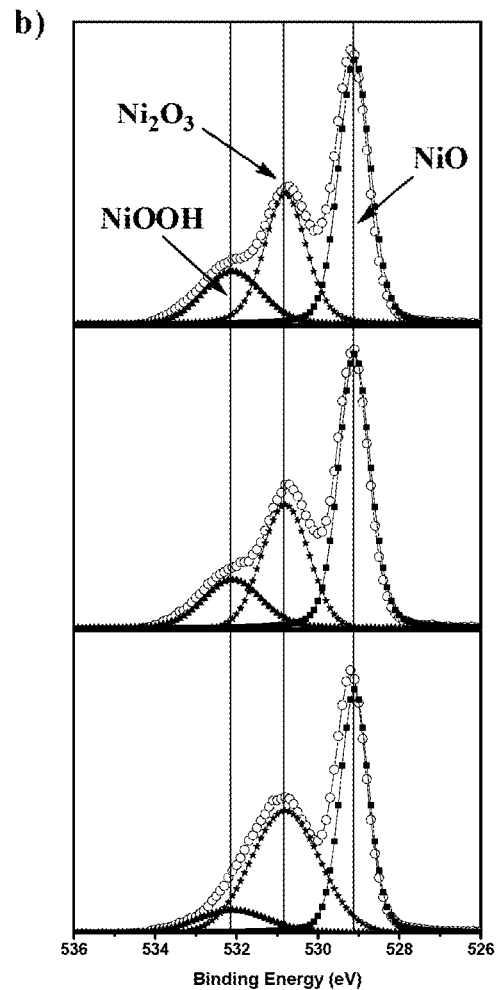

To demonstrate the capability of NiOx films to perform as highly efficient HTL over a wide range of temperatures, X-ray photoelectron spectroscopy (XPS) analysis was used to investigate the chemical composition of the $NiO_x$ films processed under different temperatures. The Ni 2p 3/2 and O 1 s characteristic peaks of the $NiO_x$ film in XPS spectra are shown in FIG. 2. The decomposition of the XPS spectrum demonstrates that the Ni 2p spectrum can be well fitted by two different oxidation states ($Ni^{2+}$ and $Ni^{3+}$) in the form of a Gaussian function. When the $NiO_x$ film receives no annealing treatment or other UVO or $O_2$-plasma treatment, rather remarkable contributor peaks of $Ni^{3+}$ state such as NiOOH (Ni 2p 3/2 at 856.3 eV and O 1 s at 532.1 eV), $Ni_2O_3$ (Ni 2p 3/2 at 855.0 eV and O 1 s 530.8 eV), and another $Ni^{2+}$ state NiO (Ni 2p 3/2 at 853.6 eV and O 1 s 529.1 eV) appear. As calculated from the integral area in the Ni 2p spectrum, the three composition concentration ratio of NiOOH, $Ni_2O_3$, and NiO is about 1.13:1.22:1 and the atomic ratio between Ni and O is about 1:1.14, which illustrates that the composition of the nickel oxide is non-stoichiometric. The result is completely different from the previously reported ones that only additional simultaneous $O_2$-plasma or UVO treatment or annealing treatment can lead to the formation of $Ni^{3+}$ state in NiOOH species. Meanwhile, after 100° C. annealing treatment of the $NiO_x$ film, no apparent shift or change of the dominant peaks in the Ni 2p 3/2 and O 1 s spectra was observed, which indicates that the major composition of the $NiO_x$ thin films remains unchanged. However, when the annealing temperature is above 200° C., the composition of $NiO_x$ film changes such that NiOOH peaks are weakened and the $Ni_2O_3$ peaks are strengthened in the XPS spectra in FIGS. 2a and b. The variation in characteristic peaks by 200° C. annealing suggests a partial composition conversion from NiOOH to $Ni_2O_3$. Upon high temperature annealing, the change in the non-stoichiometric $NiO_x$ film composition where excessive $Ni_2O_3$ is generated, can have a detrimental impact on the electrical properties and thus the device performance of the $NiO_x$ HTL. As a result, in addition to room temperature, the $NiO_x$ NPs are able to form effective and stable HTL over a wide range of annealing temperatures up to 150° C. without inducing detrimental changes in composition.

Figures 3A, 3B, 3C:
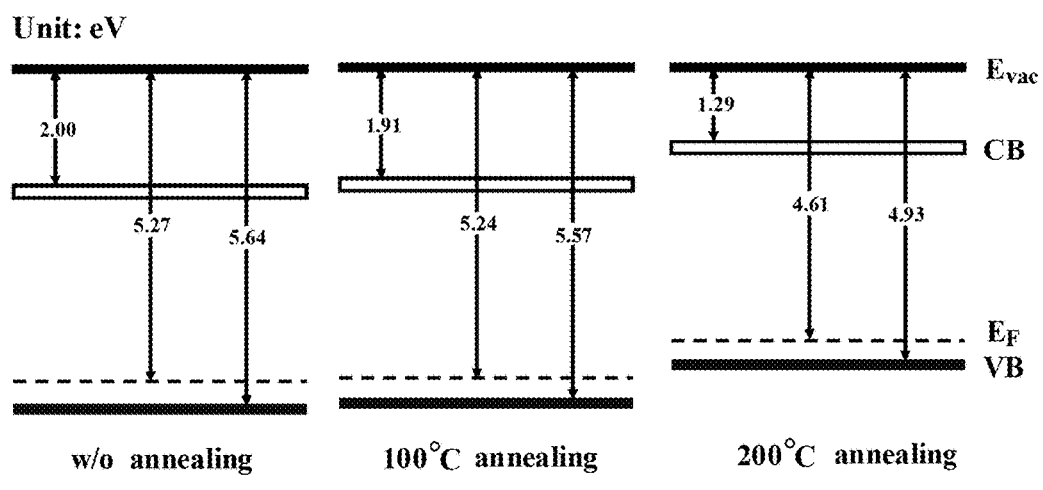
FIGS. 3(a), 3(b) and 3(c) is energy-level diagrams of the investigated $NiO_x$ films (20 nm) with no annealing, 100° C. annealing and 200° C. annealing, respectively.

Ultraviolet photoelectron spectroscopy (UPS) was utilized to investigate the energy band structures of the as-deposited and annealed NiO$_x$ films at different temperatures. As calculated from the UPS results, the band diagram parameters including vacuum level ($E_{Vac}$), conduction band (CB), $E_F$ and valence band (VB) are shown in FIG. 3. The as-deposited NiO$_x$ films show an $E_F$ of 5.25 eV. The appropriate $E_F$ of post-treatment-free NiO$_x$ film favors ohmic contact formation to HOMO of donor materials in bulk heterojunction (BHJ). The CB of NiO$_x$, which is 1.85 eV from vacuum level, allows NiO$_x$ to serve as an effective electron blocking layer to suppress electron recombination at the anode. The VB is 0.24 eV below the $E_F$, indicating that NiO$_x$ is a typical p-type semiconductor. After 150° C. annealing treatment, the $E_F$ of the film is slightly changed to 5.13 eV, accompanied with CB of 1.76 eV and VB of 5.40 eV, which was almost the same with the as-deposited NiO$_x$ film. However, when the NiO$_x$ film is annealed at 200° C., the $E_F$ of the NiO$_x$ significantly decreases from 5.25 eV to 4.61 eV. Both the CB and VB decrease to 1.33 eV and 4.97 eV respectively, which indicates that the electrical properties of the film have been modified. Due to the larger energy mismatch with the HOMO of the donor materials (usually above 5.0 eV), the NiO$_x$ film annealed at 200° C. can no longer function as an effective HTL. These results are consistent with the XPS results described previously, where the NiO$_x$ and oxidation states of the metal oxide are changed at relatively high temperature (over 200° C.).

To demonstrate that the NiOx film can function as an effective HTL, OSCs were fabricated and characterized. Four polymers with different bandgaps, P3HT, PCDTBT, PTB7 and PTB7-Th with HOMO energy levels of 5.00 eV, 5.30 eV, 5.14 eV and 5.22 eV respectively, were used to examine the effect of NiO$_x$ film as an efficient HTL. Device optimization was mainly focused on fine adjustment of the thickness and annealing temperature of the NiO$_x$ film. OSCs with conventional structure of ITO/NiO$_x$/Active layer/Ca (20 nm)/Al (100 nm) were fabricated. OSCs with PEDOT:PSS (34 nm) HTLs were also compared as a control. The current density-voltage (J-V) characteristics of P3HT devices using NiO$_x$ with different annealing temperatures were plotted in Table 1. It can be clearly seen that all the devices show similar performances from w/o annealing to 150° C. The results confirm that the film has mostly the same composition and WF below 150° C. annealing temperature, which is consistent with the XPS and UPS analytic results. Meanwhile, an annealing temperature over 200° C. significantly degrades the device performance due to a mismatch of WF of the NiO$_x$ to the HOMO of P3HT. The results demonstrate that the NiO$_x$ films in this work can function as effective HTLs without any post-treatment, as well as offer a wide temperature applicability from room-temperature to 150° C.

The optimized NiO$_x$ films were then applied to low bandgap polymers such as PCDTBT ($E_{gap}$=1.70), with a larger $V_{OC}$ due to the ionization potential (IP) higher than P3HT, to demonstrate its applicability to work as efficient HTL for low bandgap polymers. The WF of NiO$_x$ (5.25 eV) is very close to the HOMO level of the donor polymer PCDTBT (5.30 eV), which can enhance the hole extraction from the photoactive layer. A comparison of the illuminated current density-voltage (J-V) measurements for both NiO$_x$ and PEDOT:PSS based devices is presented in Table 2. The PCDTBT:PC$_{71}$BM devices employing PEDOT:PSS HTL exhibited an average $V_{OC}$ of 0.878 V, $J_{SC}$ of 10.81 mA cm$^{-2}$ and FF of 57.52% to yield a PCE of 5.45%. While utilizing the NiO$_x$ thin film as HTLs, a remarkable 17.8% increment in device performance accompanied by an average $V_{OC}$ of 0.906 V, $J_{SC}$ of 11.36 mA cm$^{-2}$, FF of 62.35% and PCE of 6.42% was realized. The significant enhancement was mainly due to the ability of NiO$_x$ to form favorable energetic alignment with the active layer, as compared to the alignment formed with PEDOT:PSS. This result is comparable to some reported device performance in the literature for NiO$_x$ films prepared by other techniques. In addition, different from PEDOT:PSS, the $E_{opt}$ of the NiO$_x$ is 3.64 eV, indicating that the conduction band is 1.85 eV above the LUMO of the donor PCDTBT (3.60 eV) and acceptor PC$_{71}$BM (4.00 eV). This energetic orientation provides 1.75 eV to 2.15 eV energy barriers to electron collection at the anode and thus demonstrating effective electron-blocking properties of the NiO$_x$ which contributes to an increment in $V_{OC}$ through reducing leakage current and photocurrent recombination at the anode. The series resistance for the devices with NiO$_x$ HTLs and the PEDOT:PSS reference devices was calculated to be 2.65 Ω cm$^2$ and 4.46 Ω cm$^2$, respectively. Improved contacts between active layer and anode, which facilitates free carriers extraction and transport, enhanced both $J_{SC}$ and FF in the devices with NiO$_x$ HTLs.

Figure 4A:
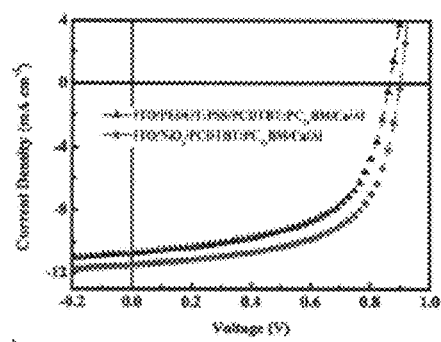
FIGS. 4(a) to 4(c) are current density-voltage (J-V) characteristics for PCDTBT, PTB7 and PTB7-Th, respectively.
Figure 4B:
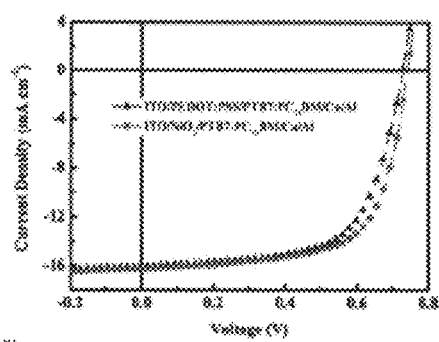
Figure 4C:
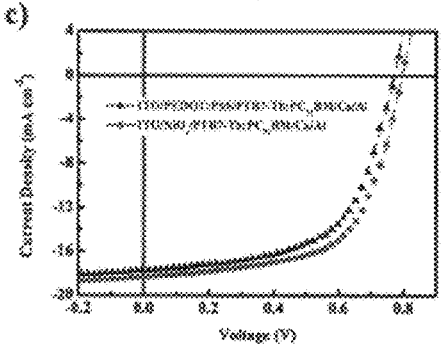
Figure 4D:
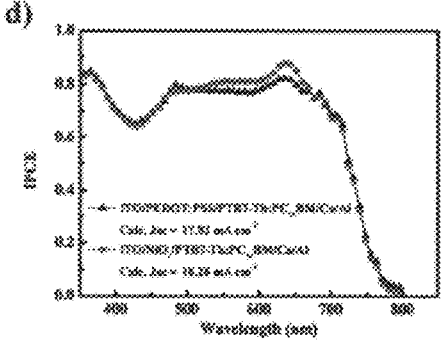
FIG. 4(d) is an IPCE curve for the same materials.

To demonstrate the general viability of NiO$_x$ as an efficient HTL for low bandgap polymers, two PTB-derivatives, PTB7 (Egap=1.63 eV) and PTB7-Th (Egap=1.58 eV) were also selected to fabricate standard OSCs devices. FIG. 4a shows the J-V curves PCDTBT. FIGS. 4b and 4c show the J-V curves of the PTB7 and PTB7-Th based BHJ OSCs with the PEDOT:PSS or NiO$_x$ HTLs, respectively. For PTB7: PC$_{71}$BM based devices, device performance with NiO$_x$ HTL has a $V_{OC}$ of 0.744 V, $J_{SC}$ of 16.10 mA cm$^{-2}$, FF of 66.42%, and PCE of 7.96%, which is slightly higher than PEDOT: PSS devices ($V_{OC}$ of 0.735 V, $J_{SC}$ of 15.84 mA cm$^{-2}$, FF of 63.63% and PCE of 7.41%). The results show the same energy alignment ability with a low band gap polymer PTB7 based device. The NiO$_x$ HTL calculated $J_{SC}$ (16.05 mA cm$^{-2}$) from the IPCE spectra matched well with the $J_{SC}$ (16.10 mA cm$^{-2}$) recorded from the J-V curves. The maximum IPCE spectrum in NiO$_x$ devices is over 70%, indicative of highly efficient photon-to-electron conversion. For PTB7-Th:PC$_{71}$BM based OSCs, the device with NiO$_x$ HTL has an average PCE of 9.16% with $V_{OC}$ of 0.794 V, $J_{SC}$ of 18.32 mA cm$^{-2}$ and FF of 63.10%, which has a noticeable enhancement compared with the PCE of the control device using PEDOT:PSS (PCE of 8.60% with a $V_{OC}$ of 0.782 V, $J_{SC}$ of 18.03 mA cm$^{-2}$ and FF of 60.97%). The $R_S$ with NiO$_x$ HTLs and PEDOT:PSS devices were 2.20 Ω cm$^2$ and 3.37 Ω cm$^2$, respectively. Rationalized by a similar rule as noted above, the reduced $R_S$ results in better electrical contact thus improved FF, which is beneficial for device performance. The OSCs with the 20 nm NiO$_x$ HTL shows higher IPCE at wavelengths of 500-700 nm compared with PEDOT:PSS HTL as shown in FIG. 4d. The IPCE maximum is over 80%, indicating an effective charge carrier generation and collection property. The calculated $J_{SC}$ 18.28 mA cm$^{-2}$ from the IPCE spectra is consistent with the $J_{SC}$ 18.32 mA cm$^{-2}$ recorded from the J-V measurements. Consequently, the efficient hole transport property of our low-temperature processing NiO$_x$ HTLs comparable to PEDOT:PSS is demonstrated with different bandgap polymeric donors in OSCs.

Figure 5A:
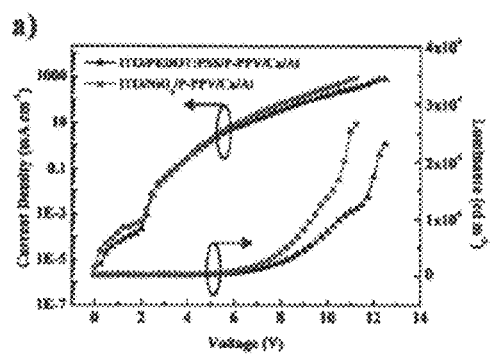
FIG. 5(a) is a J-V-L curve and FIG. 5(b) is a LE-J-L curve of OLEDs, PEDOT:PSS and $NiO_x$.
Figure 5B:
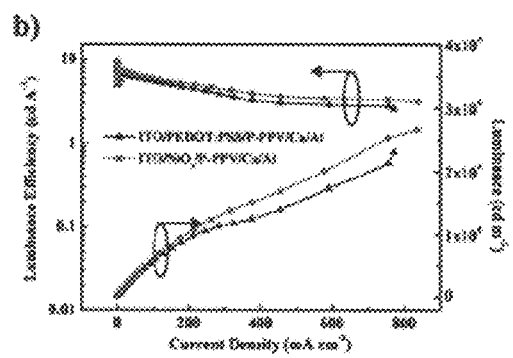

OLEDs employing solution-processed NiO$_x$ as HTLs were fabricated with a conventional structure of ITO/NiO$_x$/emission layer (80 nm)/Ca (20 nm)/Al (100 nm) where the emission layer is poly[2-(4-(3',7'-dimethyloctyloxy)-phenyl)-p-phenylene-vinylene] (P-PPV). OLEDs with PEDOT: PSS (34 nm) HTLs were also compared as a control. The current density-voltage-luminance density (J-V-L) characteristics and luminance efficiency-current density-luminance (LE-J-L) characteristics for devices are shown in FIGS. 5a and 5b, respectively. The $NiO_x$ film based devices had a turn-on voltage of 3.75 V, a maximum brightness of 26630 cd m$^{-2}$ at 11.25 V, a current efficiency of 9.72 cd A$^{-1}$, which is slightly higher than that of PEDOT:PSS-based devices with a maximum brightness of 23100 cd m$^{-2}$ at 12.50 V, and a current efficiency of 9.20 cd A$^{-1}$. The results reveal that OLEDs with efficient $NiO_x$ HTLs can be comparable and competitive with that of PEDOT:PSS HTLs.

Following are examples that illustrate the procedures for practicing the invention. These examples should not be construed as limiting.

EXAMPLE 1

The OSCs based on P3HT were fabricated by using the conventional structure of ITO/$NiO_x$/Active layer/Ca (20 nm)/Al (100 nm). With different annealing temperature of $NiO_x$ film, the device performances of OSCs based on P3HT are summarized in Table 1.

TABLE 1

Device performance at different annealing temperatures for $NiO_x$ based OSCs with conventional structure of ITO/$NiO_x$/P3HT:$PC_{61}BM$/Ca/Al.

| $NiO_x$ Annealing Temperature | $V_{OC}$ (V) | $J_{SC}$ (mA cm$^{-2}$) | FF (%) | $R_S$ ($\Omega$ cm$^2$) | PCE (%) |
|---|---|---|---|---|---|
| w/o | 0.588 ± 0.001 | 9.72 ± 0.24 | 67.31 ± 0.76 | 2.10 ± 0.07 | 3.83 ± 0.10 |
| 50° C. | 0.587 ± 0.003 | 9.68 ± 0.31 | 66.16 ± 0.80 | 2.24 ± 0.10 | 3.77 ± 0.15 |
| 100° C. | 0.588 ± 0.002 | 9.67 ± 0.16 | 67.20 ± 0.62 | 2.13 ± 0.04 | 3.81 ± 0.07 |
| 150° C. | 0.581 ± 0.004 | 9.82 ± 0.22 | 66.50 ± 0.65 | 2.16 ± 0.07 | 3.80 ± 0.09 |
| 200° C. | 0.560 ± 0.004 | 9.01 ± 0.37 | 57.90 ± 1.35 | 4.17 ± 0.11 | 2.92 ± 0.24 |
| 300° C. | 0.481 ± 0.008 | 8.96 ± 0.35 | 42.99 ± 2.58 | 7.36 ± 0.09 | 1.85 ± 0.32 |

EXAMPLE 2

The OSCs based on different bandgap polymers were fabricated by using the conventional structure of ITO/$NiO_x$/Active layer/Ca (20 nm)/Al (100 nm). The control OSCs were also fabricated by using PEDOT:PSS layer as comparisons. The device performance of OSCs based on different bandgap polymers with $PC_{71}BM$ were summarized in Table 2.

TABLE 2

Device performances of PEDOT:PSS or $NiO_x$ based OSCs using different bandgap polymers with $PC_{71}BM$.

| Device structures | $V_{OC}$ (V) | $J_{SC}$ (mA cm$^{-2}$) | FF (%) | $R_S$ ($\Omega$ cm$^2$) | PCE (%) |
|---|---|---|---|---|---|
| PEDOT:PSS/PCDTBT | 0.878 ± 0.003 | 10.81 ± 0.22 | 57.52 ± 0.79 | 4.46 ± 0.10 | 5.45 ± 0.18 |
| $NiO_x$/PCDTBT | 0.906 ± 0.002 | 11.36 ± 0.31 | 62.35 ± 0.72 | 2.65 ± 0.06 | 6.42 ± 0.20 |
| PEDOT:PSS/PTB7 | 0.735 ± 0.003 | 15.84 ± 0.30 | 63.63 ± 1.05 | 2.62 ± 0.09 | 7.41 ± 0.16 |
| $NiO_x$/PTB7 | 0.744 ± 0.004 | 16.10 ± 0.27 | 66.42 ± 0.66 | 1.74 ± 0.05 | 7.96 ± 0.20 |
| PEDOT:PSS/PTB7-Th | 0.782 ± 0.003 | 18.03 ± 0.21 | 60.97 ± 0.60 | 3.37 ± 0.08 | 8.60 ± 0.16 |
| $NiO_x$/PTB7-Th | 0.794 ± 0.002 | 18.32 ± 0.17 | 63.10 ± 0.45 | 2.20 ± 0.10 | 9.16 ± 0.12 |

Based on these results it can be seen that the $NiO_x$ nanoparticles are highly efficient hole transport layers in optoelectronic applications based on several donor polymers with different HOMO energy levels. Compared with conventional PEDOT:PSS-buffered devices, the $NiO_x$-buffered OSCs and OLEDs achieve improved or comparable device performances. The excellent optoelectronic performances can be realized at room temperature without any post-treatments to form the HTL films. Due to the desirable work function, $NiO_x$ is a useful as an efficient HTL for high IP donor materials in order to maximize device performance. The $NiO_x$ HTLs can be applied to various optoelectronic devices, including not only OSCs, but also OLEDs.

It should be understood that the examples and embodiments described herein are for illustrative purposes only and that various modifications or changes in light thereof will be suggested to persons skilled in the art and are to be included within the spirit and purview of this application and the scope of the appended claims. In addition, any elements or limitations of any invention or embodiment thereof disclosed herein can be combined with any and/or all other elements or limitations (individually or in any combination) or any other invention or embodiment thereof disclosed herein, and all such combinations are contemplated with the scope of the invention without limitation thereto.

What is claimed is:

1. A method for preparing non-stoichiometric $NiO_x$ nanoparticles, with a composition of NiO (Ni$^{2+}$), NiOOH (Ni$^{3+}$), and $Ni_2O_3$ (Ni$^{3+}$), wherein the method comprises:

using a base to react with Ni ions in water without added heat to form an electrically insulated and undispersed intermediate;

grinding the intermediate to form it into a uniform grain size;

combusting the intermediate in air at a temperature of 270° C. to cause oxygen to interact with a nickel-deficient lattice and further form non-stoichiometric $NiO_x$ nanoparticles.

2. The method of claim 1, wherein the $NiO_x$ nanoparticles have dark-black color or atrous color.

3. The method of claim 1, wherein the $NiO_x$ nanoparticles comprise vacancy-induced Ni$^{2+}$ and Ni$^{3+}$ composition.

4. The method of claim 1, wherein the non-stoichiometric $NiO_x$ nanoparticles contain nickel oxyhydroxide (NiOOH) which have a plurality of hydroxyl groups.

5. The method of claim 1, wherein the step of using a base to form undispersed intermediate involves use of a dispersing agent that is water/methanol, water/ethanol, or water/other alcoholic solvents.

6. The method of claim 1 wherein the step of combusting occurs for at least 2 hours.

7. The method of claim 1 wherein nanoparticle size is about 3-5 nm.

* * * * *